United States Patent
Sugahara et al.

(10) Patent No.: US 7,056,756 B2
(45) Date of Patent: Jun. 6, 2006

(54) NITRIDE SEMICONDUCTOR LASER DEVICE AND FABRICATING METHOD THEREOF

(75) Inventors: Gaku Sugahara, Nara (JP); Yoshiaki Hasegawa, Katano (JP); Akihiko Ishibashi, Osaka (JP); Toshiya Yokogawa, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 176 days.

(21) Appl. No.: 10/611,851

(22) Filed: Jul. 3, 2003

(65) Prior Publication Data

US 2004/0005728 A1 Jan. 8, 2004

(30) Foreign Application Priority Data

| Jan. 21, 2002 | (JP) | ............................. 2002-011337 |
| Jan. 20, 2003 | (JP) | ....................... PCT/JP03/00398 |

(51) Int. Cl.
H01L 21/00 (2006.01)

(52) U.S. Cl. .......................................... 438/47; 438/22

(58) Field of Classification Search ................ 372/43, 372/45, 46, 44.01, 46.01; 257/94, 459, 678; 438/22, 47

See application file for complete search history.

(56) References Cited

U.S. PATENT DOCUMENTS 5,422,901 A * 6/1995 Lebby et al. ................. 372/36
6,761,303 B1 * 7/2004 Ozawa .......................... 372/46
6,770,960 B1 * 8/2004 Oohata ......................... 257/678
6,815,790 B1 * 11/2004 Bui et al. ..................... 257/459
2001/0002917 A1 6/2001 Ozawa

FOREIGN PATENT DOCUMENTS

| JP | 10-163536 | 6/1998 |
| JP | 10-223930 | 8/1998 |
| JP | P2000-244012 A | 9/2000 |
| JP | P2001-168442 A | 6/2001 |

OTHER PUBLICATIONS

Machine Translation of JP 2000-233012 (original published Sep. 8, 2000).*

* cited by examiner

Primary Examiner—James Menefee
(74) Attorney, Agent, or Firm—McDermott Will & Emery LLP

(57) ABSTRACT

A method for fabricating a nitride semiconductor laser device including a step to expose surfaces of an n-type nitride semiconductor layer (102) and a p-type nitride semiconductor layer (108); a step to cover the surface of the multi-layered semiconductor; with an insulating film (109) that has a thickness greater than the difference in levels between the exposed surface of the n-type nitride semiconductor layer (102) and the outermost surface of the p-type nitride semiconductor layer (108); a step to flatten the surface of the insulating film (109); and a step to form an n-type electrode (111) and a p-type electrode (110) electrically connected to the n-type nitride semiconductor layer (102) and the p-type nitride semiconductor layer (108), respectively. This method makes it possible to obtain a nitride semiconductor laser device that is highly reliable and exhibits an excellent heat diffusing property.

4 Claims, 3 Drawing Sheets

(a)

(b)

NITRIDE SEMICONDUCTOR LASER DEVICE AND FABRICATING METHOD THEREOF

TECHNICAL FIELD

The present invention relates to a semiconductor laser and like nitride semiconductor laser devices, and a fabricating method thereof.

BACKGROUND ART

Nitride semiconductors are excellent candidates as useful materials for short-wavelength light emitting devices because of their wide band gap. Among these, extensive research has been conducted on gallium nitride based compound semiconductors (GaN, AlGaN, GaInN, AlGaInN, and like GaN based semiconductors), and blue light emitting diodes (LED), and green LEDs have already been put to practical use. Furthermore, in order to increase the storage capacity of an optical disc apparatus, a semiconductor laser with its oscillation wavelength in the 400-nm band is in strong demand. For this reason, semiconductor lasers using GaN based semiconductors have attracted widespread attention, and are now approaching a level of practical use.

A device disclosed in Japanese Unexamined Patent Publication No. 2001-168442 (specification of U.S. Pat. No. 6,479,325) is known as a heretofore used GaN based semiconductor laser device. As shown in FIG. 3, this semiconductor laser device is formed with a junction-down configuration in which a pn-junction that includes a light-emitting active layer of the chip 210 is mounted to a sub-mount 220 that is connected to a heat sink 230 having a high heat diffusing property.

The chip 210 comprises an n-type contact layer 212, an n-type cladding layer 213, an active layer 214, a p-type cladding layer 215, a p-type contact layer 216, and a p-type electrode 217 layered in this order on the surface of a sapphire substrate 211. On the surface of the n-type contact layer 212, which has been partially removed and exposed by etching, an n-type electrode 218 is formed. As is clear from FIG. 3, the heights of the p-type electrode 217 and the n-type electrode 218 from the surface of the substrate 211 differ from each other, i.e., the p-type electrode 217 is in the higher position than the n-type electrode 218, for example, by approximately 3.5 µm.

The sub-mount 220 is formed on the surface of a supporting plate 221 by depositing lead electrode layers 222a and 222b, and solder films 223a and 223b. By pressing the chip 210 and the sub-mount 220 together while the solder films 223a and 223b are melted by heat, the p-type electrode 217 and the n-type electrode 218 in the chip 210 are joined to the lead electrode layers 222a and 222b, respectively. The rear surface of the supporting plate 221 is connected to the heat sink 230 via the solder film 222c.

The solder films 223a and 223b on the front surface of the sub-mount 220 have thicknesses corresponding to the projected heights of the p-type electrode 217 and the n-type electrode 218, respectively, in the chip 210. For example, by setting the thickness of the solder film 223a shown on the left side of FIG. 3 to be approximately 3.5 µm and the thickness of the solder film 223b shown on the right side to be approximately 7 µm, a difference in level of approximately 3.5 µm is formed between the solder films 223a and 223b. This difference in level absorbs the effect of the difference in the projection heights between the p-type electrode 217 and the n-type electrode 218 in the chip 210.

However, in a semiconductor laser device having such a structure, there is a difference in the levels of the solder films 223a and 223b. Therefore, incomplete adhesion tends to occur particularly between the p-type electrode 217 and the solder film 223a, with the result that not only the reliability of the device is decreased but also the heat generated in the chip 210 is not efficiently diffused via the solder films 223a and 223b.

On the other hand, when the solder films 223a and 223b that correspond to the p-type electrode and the n-type electrode 218 are the same thickness, problems arise due to the difference in the projection height between the p-type electrode 217 and the n-type electrode 218, wherein, as shown in FIG. 4(a), the solder film 223a that corresponds to the p-type electrode 217 is thinly expanded and the interval between the lead electrode layers 222a and 222b becomes unduly short or, as shown in FIG. 4(b), the chip 210 is mounted on the sub-mount 220 with an incline relative thereto, resulting in defective conductivity.

DISCLOSURE OF THE INVENTION

The present invention aims at solving the above problems and providing a nitride semiconductor laser device that is highly reliable and exhibits an excellent heat diffusing property, and a fabricating method thereof.

The above objects of the present invention can be achieved by a method for fabricating a nitride semiconductor laser device, which comprises a first step to form a multi-layered semiconductor on a substrate, the multi-layered semiconductor containing at least an n-type nitride semiconductor layer, an active layer, and a p-type nitride semiconductor layer; a second step to expose the surfaces of the n-type nitride semiconductor layer and the p-type nitride semiconductor layer at different heights by selectively etching the multi-layered semiconductor; a third step to cover the surface of the multi-layered semiconductor, including the exposed surfaces of the n-type nitride semiconductor layer and the p-type nitride semiconductor layer, with an insulating film that has a thickness greater than the difference in levels between the exposed surface of the n-type nitride semiconductor layer and the outermost surface of the p-type nitride semiconductor layer; a fourth step to flatten the surface of the insulating film; and a fifth step to form an n-type electrode and a p-type electrode that are electrically connected to the n-type nitride semiconductor layer and the p-type nitride semiconductor layer, respectively, through the insulating film.

The objects of the present invention can be also achieved by a nitride semiconductor laser device, which comprises a multi-layered semiconductor that is formed on a substrate and that contains at least an n-type nitride semiconductor layer, an active layer, and a p-type nitride semiconductor layer; and an n-type electrode and a p-type electrode that are electrically connected to the n-type nitride semiconductor layer and the p-type nitride semiconductor layer, respectively; characterized in that the nitride semiconductor laser device comprises an insulating film that covers the multi-layered semiconductor; the n-type electrode and the p-type electrode are electrically connected to the n-type nitride semiconductor layer and the p-type nitride semiconductor layer, respectively through the insulating film; the thickness of the insulating film is greater than the difference in levels between the surface with which the n-type electrode and the n-type nitride semiconductor layer come into contact and the outermost surface of the p-type nitride semiconductor layer; and the surface of the insulating film is flat.

BEST MODE FOR CARRYING OUT THE INVENTION

Figure 1:
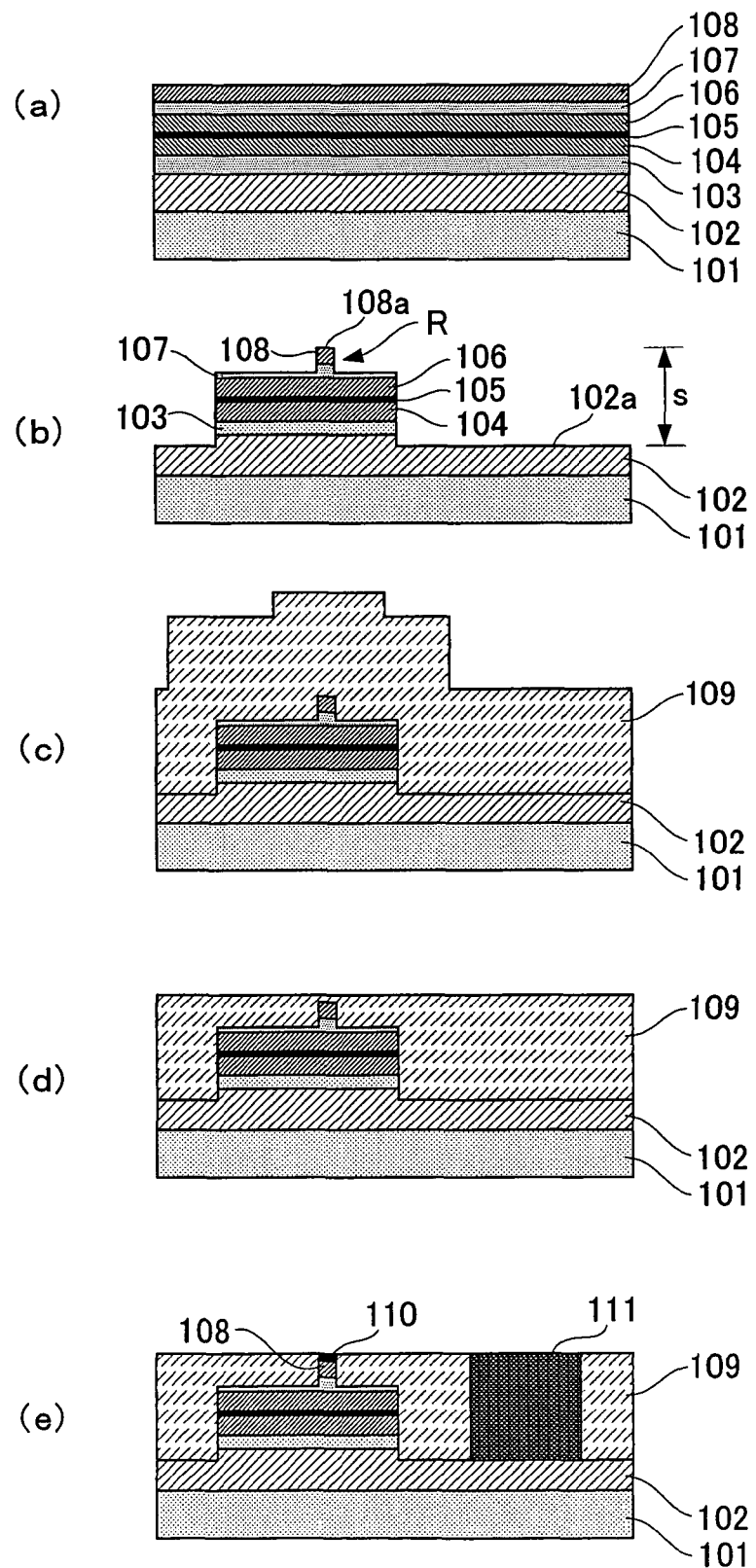
FIG. 1 shows cross-sectional views of the fabrication flow of a nitride semiconductor laser device according to one embodiment of the present invention.

Hereunder, embodiments of the present invention will be explained with reference to drawings. FIG. 1 shows cross-sectional views of the fabrication flow of a nitride semiconductor laser device according to one embodiment of the present invention. In the present embodiment, one example in which the nitride semiconductor laser device is a GaN based semiconductor laser will be explained.

First, as shown in FIG. 1(a), on a sapphire substrate 101, a buffer layer (not shown) made of GaN, an n-type contact layer 102 made of n-GaN, an n-type cladding layer 103 made of n-AlGaN, an n-type optical guide layer 104 made of n-GaN, a multi-quantum well (MQW) active layer 105 made of $Ga_{1-x}In_xN/Ga_{1-y}In_yN$ (0<y<x<1), a p-type optical guide layer 106 made of p-GaN, a p-type cladding layer 107 made of p-AlGaN, and a p-type contact layer 108 made of p-GaN are deposited by metal organic chemical vapor deposition (MOVPE) or the like, in this order, thereby producing a multi-layered semiconductor in which an active layer is sandwiched between a p-type nitride semiconductor layer and an n-type nitride semiconductor layer.

Next, photolithography is used to form a striped resist pattern (not shown) on the p-type contact layer 108. Then, using this resist pattern as a mask, a reactive-ion-etching method using a chlorine-based gas is employed to selectively etch portions of the p-type contact layer 108 and the p-type cladding layer 107, as shown in FIG. 1(b), to obtain a ridge stripe R having a width of approximately 2 μm and a height of approximately 1 μm on the surface of the multi-layered semiconductor.

Thereafter, photolithography is used to form a striped resist pattern (not shown) that has a width of several dozen μm to several hundred μm on the surface of the multi-layered semiconductor in such a manner that the ridge stripe R is covered by the resist pattern. Then, using this resist pattern as a mask, a reactive-ion-etching method using a chlorine-based gas is employed to selectively etch portions of the p-type cladding layer 107, the p-type optical guide layer 106, the multi-quantum well active layer 105, the n-type optical guide layer 104, the n-type cladding layer 103, and the n-type contact layer 102 to obtain a surface of the n-type contact layer 102 that is exposed as shown FIG. 1(b). The thickness of the etching film is, for example, approximately 1 μm. Then, the resist pattern is removed.

Thereby, as shown in FIG. 1(b), a difference in levels is formed on the surface of the multi-layered semiconductor, resulting in the surface 102a of the n-type contact layer 102 and the outermost surface 108a of the p-type contact layer 108 being exposed at different heights. The difference s in levels formed on the surface of the multi-layered semiconductor, i.e., the difference in levels between the exposed surface 102a of the n-type contact layer 102 and the outermost surface 108a of the p-type contact layer 108 is, for example, approximately 2 μm.

Then, as shown in FIG. 1(c), for example, a plasma CVD method, in which $SiH_4$ and $N_2O$ are used as source materials, is employed to deposit a silicon oxide film on the surface of the multi-layered semiconductor, forming an insulating film 109. The thickness of the deposited insulating film 109 should be greater than the largest difference s in levels of the multi-layered semiconductor (2 μm in the present embodiment). Therefore, in the present embodiment, the thickness thereof is set at approximately 4 μm. This largest difference s in levels is equal to the vertical distance between the exposed surface 102a of the n-type contact layer 102 and the outermost surface 108a of the p-type contact layer 108. As shown in FIG. 1(b), the outermost surface 108a is located in the highest portion of a p-type compound semiconductor layer that is composed of the p-type contact layer 108, the p-type cladding layer 107, and the p-type optical guide layer 106.

As shown in FIG. 1(d), the surface of the multi-layered semiconductor is then flattened by polishing or etching the surface of the insulating film 109 with, for example, a chemical-mechanical polishing (CMP) method, a resist etch back process, etc.

Next, portions of the insulating film 109 are selectively etched to form contact holes to expose the surfaces of the p-type contact layer 108 of the ridge stripe R and the n-type contact layer 102. Then, as shown in FIG. 1(e), a p-type electrode 110 made of, for example, Ni/Au is implanted in the contact hole that communicates with the p-type contact layer 108, and an n-type electrode 111 made of, for example, Ti/Al is implanted in a contact hole that communicates with the n-type contact layer 102. Thereafter, the substrate 101 is cleaved and separated to a chip 10. Thereby, a semiconductor chip of the present embodiment is fabricated.

Figure 2:
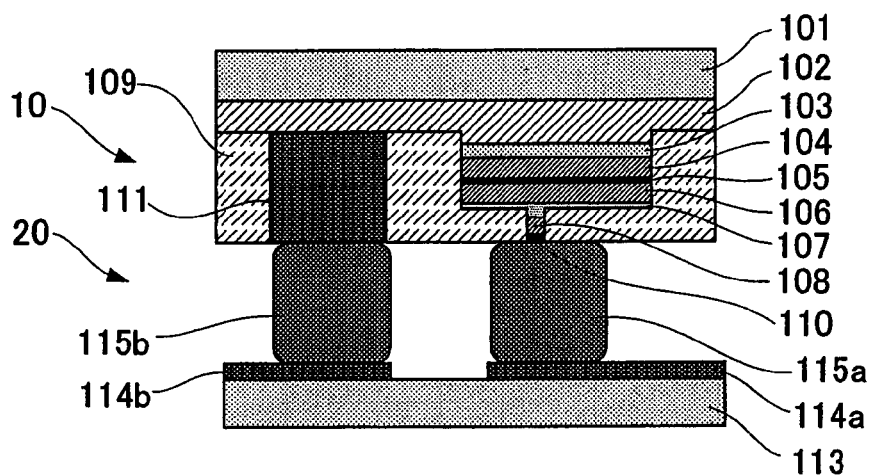
FIG. 2 shows the cross-sectional view of a nitride semiconductor laser device according to one embodiment of the present invention.
Figure 3:
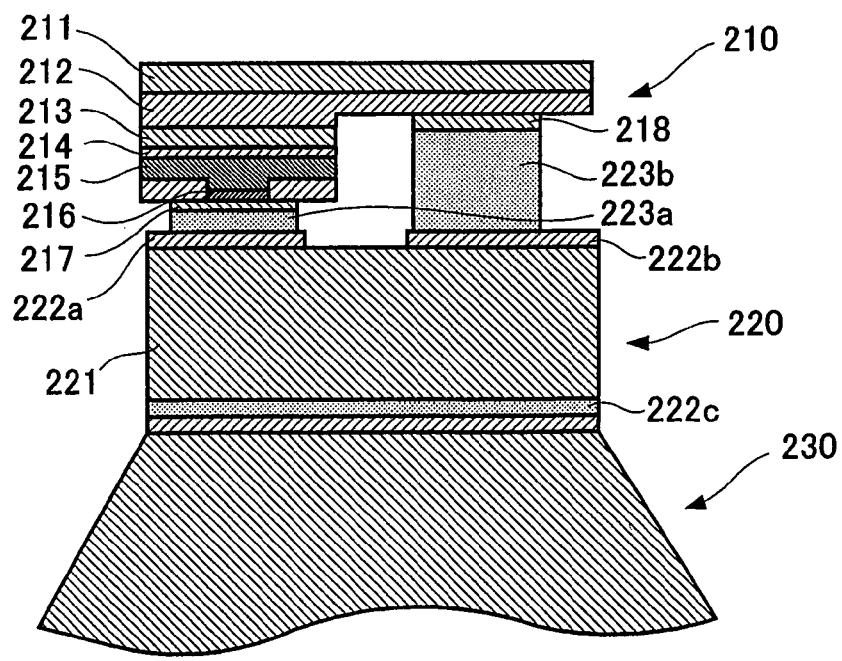
FIG. 3 shows the cross-sectional view of a prior art nitride semiconductor laser device.
Figure 4:
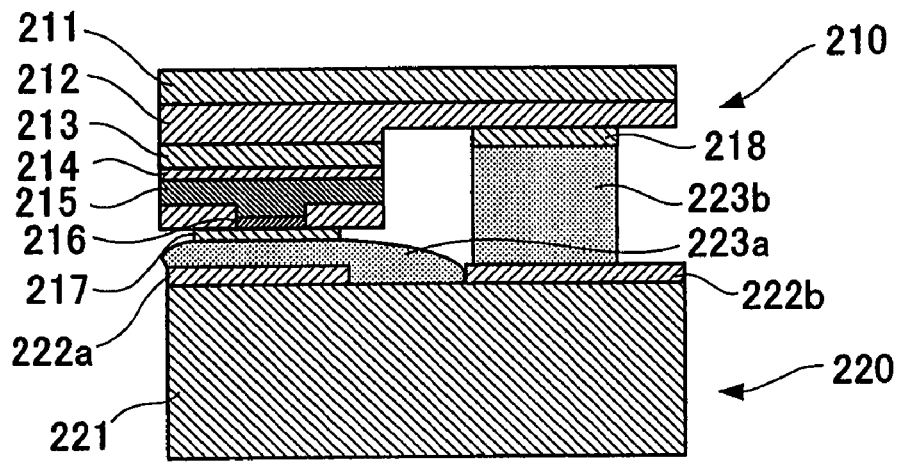
FIG. 4 shows the cross-sectional view of another prior art nitride semiconductor laser device.
Figure 4:
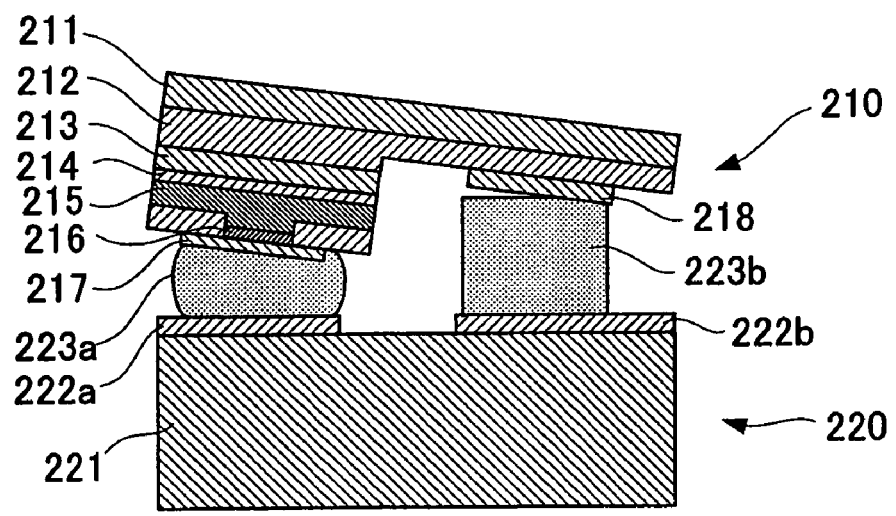

On the other hand, as shown in FIG. 2, the sub-mount is formed by placing metal wires 114a, 114b and solder structures 115a, 115b on a substrate 113 that is made of an insulating material having a high thermal conductivity, such as SiC, etc. The chip 10 is mounted to the sub-mount 20 by pressing the p-type electrode 110 and the n-type electrode 111 disposed on the surface of the chip 10 onto heat-melted solder structures 115a and 115b. Thereby, the p-type electrode 110 and the n-type electrode 111 are connected to the metal wires 114a and 114b via the solder structures 115a and 115b, respectively. The solder structures 115a and 115b are substantially the same thickness.

In the present embodiment, the projection heights of the p-type electrode 110 and the n-type electrode 111 are substantially the same and the exposed surfaces of the p-type electrode 110 and the n-type electrode 111 are formed on the same flat surface of the insulating film 109. Therefore, when the p-type electrode 110 and the n-type electrode 111 are pressed onto the solder structures 115a and 115b, it is possible to make the pressing force even. As a result, insufficient adhesion of the solder structures 115a and 115b seldom occurs, and therefore the reliability and yield of the product can be satisfactorily maintained. Furthermore, because the adhesion between the chip 10 and the sub-mount 20 can be enhanced, it is possible to efficiently diffuse the heat generated in the chip 10 into the sub-mount 20.

In a GaN based semiconductor laser having such a structure, when voltage is applied across the p-type electrode 110 and the n-type electrode 111, positive holes from the p-type electrode 110 and electrons from the n-type electrode 111 are injected into the multi-quantum well active layer

105, causing the laser to oscillate with a wavelength in the 400-nm band by generating optical gain in the multi-quantum well active layer 105.

One embodiment of the present invention was explained in detail above; however, the specific embodiments of the present invention are not limited to the above-described embodiment. For example, instead of the plasma CVD method, the insulating film 109 can be formed by using the thermal CVD method, optical CVD method, spin coating method, sputtering, and other known methods.

Furthermore, in addition to silicon oxide film, it is possible to use silicon nitride film, aluminum nitride, and like materials that have a high insulating property as the material for the insulating film 109. It is particularly preferable to use an insulating film that contains fine metal particles or fine semiconductor particles exhibiting a high thermal conductivity for the insulating film 109. This makes it possible to improve the heat diffusing property and to efficiently diffuse the heat that is generated in the chip 10.

Note that, in FIG. 1, layer 102 is the n-type contact layer, layer 103 is the n-type cladding layer, and layer 104 is the n-type optical guide layer; however, it is also possible to fabricate a nitride semiconductor laser device of the present invention with an n-type nitride semiconductor layer (composed of an n-type contact layer, an n-type cladding layer, and an n-type optical guide layer) as layer 104, a second n-type electrode as layer 103, and an electrically conductive material, such as metal or the like as layer 102, wherein a semiconductor laser device that is composed of the constituent components having reference numbers of 103 to 108 is attached to a substrate 101 provided with the electrically conductive material 102 by adhesion or soldering, and the steps shown in FIGS. 1(*c*) to (*e*) and FIG. 2 are conducted. In this case, it is possible to obtain almost the same technical effects as described above.

INDUSTRIAL APPLICABILITY

As described above, the present invention provides a nitride semiconductor laser device having high reliability and an excellent heat diffusing property, and a method for fabricating the same.

The invention claimed is:

1. A method for fabricating a nitride semiconductor laser device, which comprises;

a first step to form a multi-layered semiconductor on a substrate, the multi-layered semiconductor containing at least an n-type nitride semiconductor layer, an active layer, and a p-type nitride semiconductor layer;

a second step to expose the surfaces of the n-type nitride semiconductor layer and the p-type nitride semiconductor layer at different heights by selectively etching the multi-layered semiconductor;

a third step to cover the surface of the multi-layered semiconductor, including the exposed surfaces of the n-type nitride semiconductor layer and the p-type nitride semiconductor layer, with an insulating film that has a thickness greater than the difference in levels between the exposed surface of the n-type nitride semiconductor layer and the outermost surface of the p-type nitride semiconductor layer;

a fourth step to flatten the surface of the insulating film; and a fifth step to form an n-type electrode and a p-type electrode that are electrically connected to the n-type nitride semiconductor layer and the p-type nitride semiconductor layer, respectively, through the insulating film, wherein the exposed surfaces of the n-type electrode and the p-type electrode are formed on the same flattened surface of the insulating film.

2. The method for fabricating a nitride semiconductor laser device according to claim 1, which further comprises;

a sixth step, following the fifth step, to press-fit the surface of the insulating film to a submount containing a first wire and a second wire by using heat-melted solder structures and electrically connect the n-type electrode and the p-type electrode to the first wire and the second wire, respectively.

3. The method for fabricating a nitride semiconductor laser device according to claim 1, wherein the insulating film contains fine-grains of a metal or a semiconductor.

4. The method for fabricating a nitride semiconductor laser device according to claim 1, wherein, in the fifth step, the n-type electrode and the p-type electrode are formed so as to be connected to the exposed surfaces of the n-type nitride semiconductor layer and the p-type nitride semiconductor layer, respectively.

* * * * *